United States Patent [19]
Tepman

[11] Patent Number: 6,071,055
[45] Date of Patent: Jun. 6, 2000

[54] FRONT END VACUUM PROCESSING ENVIRONMENT

[75] Inventor: Avi Tepman, Cupertino, Calif.

[73] Assignee: Applied Materials, Inc., Santa Clara, Calif.

[21] Appl. No.: 08/940,850

[22] Filed: Sep. 30, 1997

[51] Int. Cl.$^7$ ............................................. B65G 51/02
[52] U.S. Cl. ............................ 414/217; 414/937; 414/939
[58] Field of Search ....................... 414/937, 217, 414/939, 935

[56] References Cited

U.S. PATENT DOCUMENTS

| | | | |
|---|---|---|---|
| 4,785,962 | 11/1988 | Toshima | 220/260 |
| 4,819,167 | 4/1989 | Cheng et al. | 364/167.01 |
| 5,120,019 | 6/1992 | Davis, Jr. | 251/193 |
| 5,133,284 | 7/1992 | Thomas et al. | 118/719 |
| 5,186,718 | 2/1993 | Tepman et al. . | |
| 5,226,632 | 7/1993 | Tepman et al. . | |
| 5,275,303 | 1/1994 | Szalai | 220/264 |
| 5,292,222 | 3/1994 | Malagrino et al. | 294/64.1 |
| 5,292,393 | 3/1994 | Maydan et al. | 156/345 |
| 5,302,209 | 4/1994 | Maeda et al. | 118/719 |
| 5,339,128 | 8/1994 | Tateyama et al. | 354/337 |
| 5,363,872 | 11/1994 | Lorimar . | |
| 5,404,894 | 4/1995 | Shiraiwa | 414/937 |
| 5,469,035 | 11/1995 | Lowrance . | |
| 5,494,494 | 2/1996 | Mizuno et al. | 29/25.01 |
| 5,505,779 | 4/1996 | Mizuno et al. | 118/719 |
| 5,626,675 | 5/1997 | Sakamoto et al. | 414/935 |
| 5,700,127 | 12/1997 | Harada et al. | 414/937 |
| 5,779,799 | 7/1998 | Davis | 414/937 |
| 5,788,447 | 8/1998 | Yonemitsu et al. | 414/937 |
| 5,838,121 | 11/1998 | Fairbairn et al. | 318/45 |
| 5,844,195 | 12/1998 | Fairbairn et al. | 219/121.43 |
| 5,855,681 | 1/1999 | Maydan et al. . | |
| 5,902,088 | 5/1999 | Fairbairn et al. | 414/217 |
| 5,905,302 | 5/1999 | Lane et al. | 257/678 |
| 5,909,994 | 6/1999 | Blum et al. | 414/217 |
| 5,911,834 | 6/1999 | Fairbairn et al. | 134/1.3 |

FOREIGN PATENT DOCUMENTS

| | | | |
|---|---|---|---|
| 5-47896 | 3/1993 | Japan | 414/940 |

OTHER PUBLICATIONS

Z. Shiller and S. Dubowski, "Robot Path Planning with Obstacles, Actuator, Gripper, and Payload Constraints," International Journal of Robotics Research, vol. 8, No. 6, Dec. 1989, pp. 3–18.

Z. Shiller and H.H. Lu, "Computation of Path Constrained Time Optimal Motions With Dynamic Singularities," Transactions of the ASME, Journal of Dynamic Systems, Measurement, and Control, vol. 114, Mar. 1992, pp. 34–40.

Mattson Brochure.

U.S. application No. 08/749,612, Fairbain et al., filed Nov. 18, 1996.

U.S. application No. 08/751,524, Fairbain et al., filed Nov. 18, 1996.

U.S. application No. 08/752,463, Altwood et al., filed Nov. 18, 1996.

Novellus Brochure.

U.S. application No. 08/749,614, Sunder, filed Nov. 18, 1996.

U.S. application No. 08/746,859, Kroeker, filed Nov. 18, 1996.

*Primary Examiner*—Thomas J. Brahan
*Attorney, Agent, or Firm*—Thomason, Moser and Patterson

[57] ABSTRACT

The present invention provides a wafer process system that incorporates a multiple wafer processing system, such as a tandem wafer processing system, and a front end staging apparatus. The front end staging apparatus includes a first transfer chamber in communication with a pair of loadlocks for introducing wafers into the system. A robot within the first transfer chamber moves individual wafers between the loadlocks, optional single wafer process chambers radially disposed about and in communication with the first transfer chamber, and a pair of intermediate staging chambers. The intermediate staging chambers communicate with both the first transfer chamber and a second transfer chamber of the tandem process system. A robot within the second transfer chamber moves the wafers, in tandem, between the intermediate staging chambers and tandem process chambers disposed about the periphery and communicating with the second transfer chamber.

22 Claims, 8 Drawing Sheets

FRONT END VACUUM PROCESSING ENVIRONMENT

BACKGROUND OF THE INVENTION

1. Field of the Invention

The present invention relates to a method and apparatus, including a system and individual system components, for concurrent processing of multiple wafers in the fabrication of integrated circuits. More particularly, the present invention provides a front end vacuum processing apparatus for a cluster tool adapted to move and process wafers in tandem.

2. Background of the Related Art

The term "cluster tool" generally refers to a modular, multichamber, integrated processing system having a central wafer handling module and a number of peripheral process chambers. Cluster tools have become generally accepted as effective and efficient equipment for manufacturing advanced microelectronic devices. Wafers are introduced into a cluster tool where they undergo a series of process steps sequentially in various process chambers to form integrated circuits or flat panel displays. The transfer of the wafers between the process chambers is typically managed by a wafer handling module located in a central transfer region. Typically, cluster tools are of two different types: single wafer processing or batch wafer processing. Single wafer processing generally refers to a chamber configuration in which a single wafer is located in a chamber for processing. Batch wafer processing generally refers to a chamber configuration in which multiple wafers are positioned on a turntable and are processed at various positions within a chamber as the turntable rotates through 360 degrees. A cluster tool configured for batch processing allows multiple wafers, typically from four (4) to seven (7) wafers, to be simultaneously processed in a single chamber.

One disadvantage of batch processing is that batch processing frequently provides poor deposition uniformity from the center of the wafer to the edge of the wafer. Process uniformity is important to obtain uniformity of deposition on the wafer. The poor uniformity of batch processing systems is a direct result of having multiple wafers being partially processed at multiple stations within a single chamber.

Figure 1:
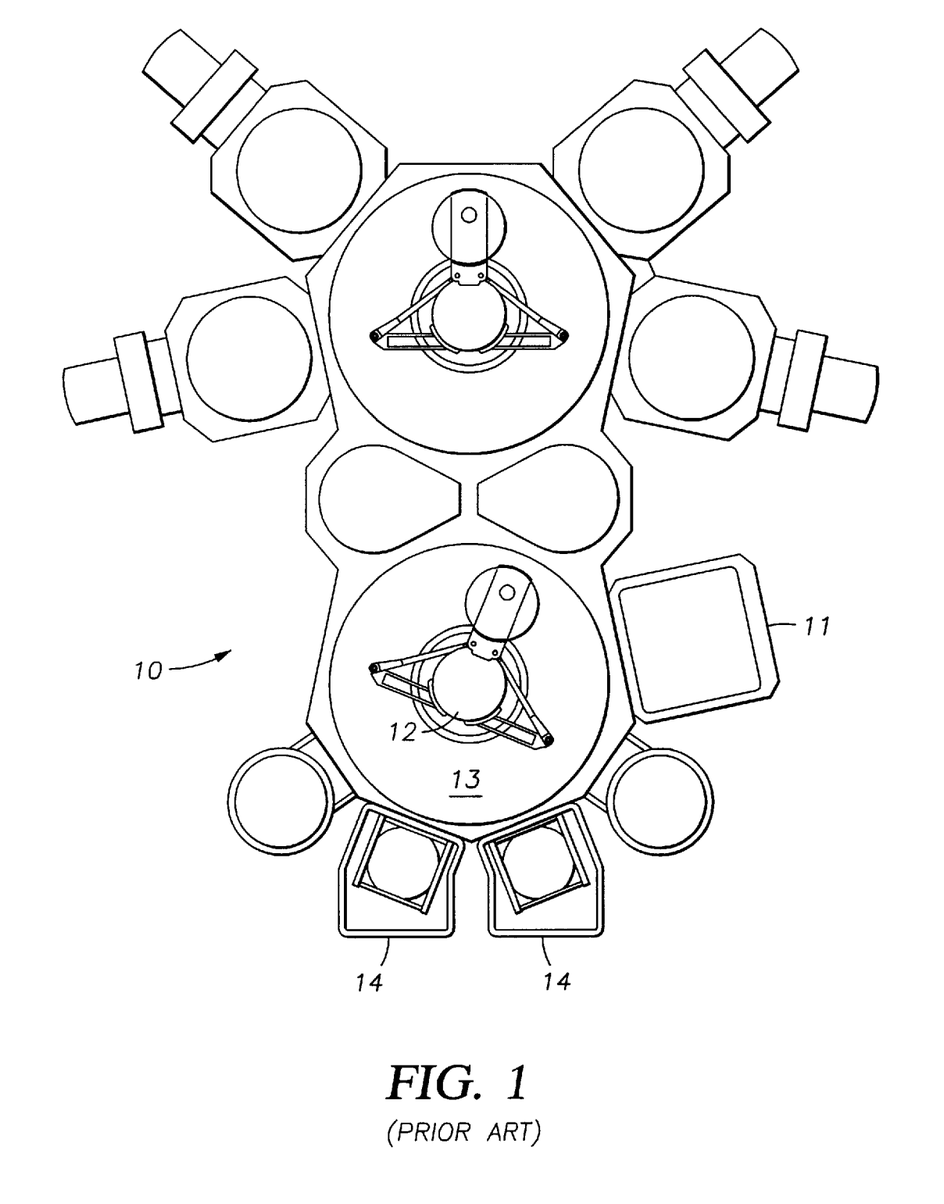
FIG. 1 is a schematic plan view of the configuration of a prior art cluster tool capable of processing a single wafer at a time.

Single wafer processing chambers act as an alternative approach to improve process uniformity. Single wafer processing is generally considered to provide a higher degree of control over process uniformity because a single wafer is positioned in a process chamber where it undergoes a complete process step, such as a deposition step or an etch step, without having to be moved to a different position within a chamber. Furthermore, the components of a single wafer processing chamber can be positioned concentrically relative to the single wafer to enhance uniformity. FIG. 1 shows a top schematic view of a cluster tool 10 having multiple single wafer processing chambers 11 mounted thereon. A cluster tool similar to that shown in FIG. 1 is available from Applied Materials, Inc. of Santa Clara, Calif. The tool includes a pair of loadlock chambers 14 and a transfer chamber 13 having a wafer handling module 12 for moving the wafers from location to location within the system, in particular, between the multiple single wafer processing chambers 11. This particular tool is shown to accommodate up to four (4) single wafer processing chambers 11 positioned radially about the transfer chamber.

Figure 2:
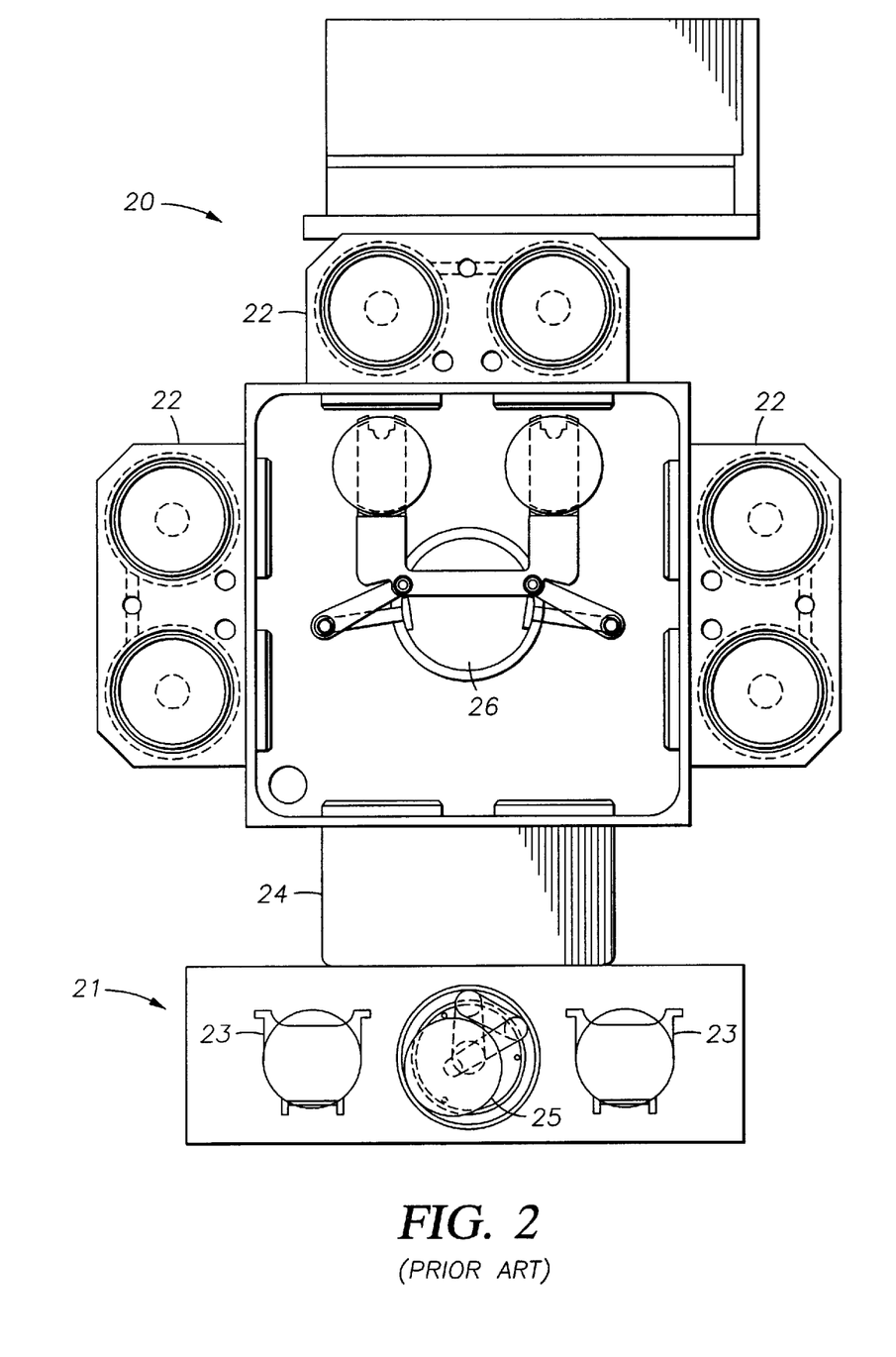
FIG. 2 is a schematic plan view of the configuration of a prior art tandem cluster tool capable of processing a pair of wafers at a time.

In an effort to provide a vacuum processing system that provides both uniform wafer processing and high throughput, a tandem system has been developed that provides an integrated system and process chambers that work in cooperation to incorporate single wafer architecture with batch wafer handling techniques. FIG. 2 shows a top schematic view of a cluster tool 20 having multiple tandem wafer processing chambers 22 mounted thereon. A cluster tool similar to that shown in FIG. 2 is available from Applied Materials, Inc. of Santa Clara, Calif. Overhead robots or technicians in the clean room in which the vacuum processing system operates, deliver a pair of wafer cassettes 23 to a front end staging area 21 of the system. A front-end robot 25 located on the front end staging area 21 detects the presence of wafers in the cassettes 23 and transfers the wafers from the front end staging area 21 and into the loadlock chamber 24. The loadlock chamber 24 has a wafer cassette with side-by-side wafer seats that is vertically indexed to align the wafers with the operating plane of the system robot 25. However, as the wafers must be transferred from the atmospheric environment of the clean room into the vacuum environment of the cluster tool 20, the loadlock 24 must repeatedly go through a pump-up and pump-down cycle. The wafers are placed into the loadlock 24 at atmospheric pressure and the loadlock 24 is subsequently pumped down to the required vacuum. The wafers are then processed and returned to the loadlock 24 which is then pumped up to atmospheric pressure for removal from the system. When the wafers are in the system, the tandem robot 26 in the transfer chamber moves the wafers, two at a time, sequentially from the loadlock chamber 24, through each of the process chambers 22, and back into the loadlock chamber 24. Thus, the tandem process system operation is a single wafer process system with batch wafer handling and is, therefore, able to obtain a higher degree of control over process uniformnity with higher throughput.

One problem associated with the tandem processing system is that the front end staging area 21 reduces the potential throughput of wafers. Each time a cassette or group of processed wafers is removed from the loadlock 24 and a cassette or group of new wafers is introduced into the system, the loadlock 24 must be slowly vented to atmospheric pressure before the processed wafers may be removed, and then pumped down to vacuum after the new cassette or group of wafers is placed in the loadlock, to complete the transfer operation. This wafer transfer operation causes the system to sit idle while the transfer of wafers in the loadlocks is accomplished. Single wafer processing systems overcome this wafer transfer delay by employing two separate loadlocks (as shown in FIG. 1). U.S. Pat. No. 5,186,718, entitled "Staged-Vacuum Wafer Processing System and Method" discloses the use of a staged vacuum system having a front end buffer chamber adapted to supply wafers to a single wafer process system and is incorporated herein by reference. This system employs two, independent loadlocks and is known to provide rapid transfer of wafers into the system. In these single wafer processing systems, the system is able to process the wafers in one loadlock, which is pumped down to the required vacuum, while the transfer of wafers is being made into the other loadlock. However, the width of the tandem chambers in combination with the desire to maintain a small footprint of the system to preserve clean room space, precludes the use of two side-by-side tandem loadlocks to service a tandem process system such as that shown in FIG. 2. In addition, the current four-sided design of the current tandem systems, as shown in FIG. 2, also precludes the use of two side-by-side tandem loadlocks without eliminating one of the tandem process chambers 22.

Accordingly, there is a need for a vacuum processing system that provides both uniform wafer processing and high throughput and that overcomes the throughput limitations of the present front end staging area and loadlock designs. The present invention provides a front end processing environment that replaces the front end staging area of the prior designs.

SUMMARY OF THE INVENTION

The present invention provides a wafer process apparatus for vacuum processing generally comprising a tandem process system and a front end process apparatus for loading and unloading wafers therefrom. Preferably, the wafer process apparatus includes at least one loadlock, but preferably two, in communication with a first transfer chamber on the front end process apparatus.

In one aspect of the invention, the wafer process apparatus includes at least one, but preferably two, intermediate staging chambers in communication with the transfer chamber of the front end apparatus (first transfer chamber) and the transfer chamber of the tandem process system (second transfer chamber) to facilitate transfer of a pair of wafers between the front end apparatus and tandem process system.

Preferably, the front end apparatus comprises the first transfer chamber, in which is housed a first robot, and a plurality of wafer process chambers in communication therewith. The first transfer chamber is in communication with the intermediate staging chambers and, thus, the tandem processing system.

In another aspect of the invention, the tandem process system includes a second transfer chamber, housing a second robot, and a plurality of tandem process chambers communicating with the second transfer chamber. The second transfer chamber is in communication with the intermediate staging chambers and, thus, the first transfer chamber of the front end process apparatus.

A preferred embodiment of the present invention provides a wafer processing system that incorporates a tandem processing system and a front end process apparatus. The front end process apparatus includes the first transfer chamber in communication with a pair of loadlocks for introducing wafers into the system. The first robot within the first transfer chamber moves individual wafers between the loadlock, one or more single wafer process chambers radially disposed about and in communication with the first transfer chamber (if desired), and the pair of intermediate staging chambers. The intermediate staging chambers communicate with both the first transfer chamber of the front end process apparatus and the second transfer chamber of the tandem process system and position a pair of wafers in a spaced relation to be moved in tandem through the tandem process system. The second robot within the second transfer chamber moves the wafers, two at a time, between the intermediate staging chambers and the tandem process chambers disposed about the periphery of, and communicating with, the second transfer chamber.

A further aspect of the present invention is a front end process apparatus described above adapted to supply wafers to a tandem process system such as a tandem process system or a batch process system.

Yet another aspect of the invention is a method for simultaneously processing a plurality of wafers in a wafer process system, comprising the steps of introducing the wafers into a front end process apparatus adapted to handle a single wafer at a time, preferably via a loadlock, moving the wafers into a pair of interconnected intermediate staging chambers so that the pair of intermediate staging chambers each contain a wafer therein, and subsequently, simultaneously transferring the wafers in tandem from the pair of intermediate staging chambers to a tandem processing chamber. Additionally, the method preferably comprises the steps of transferring the wafers from the tandem processing system back into the pair of intermediate staging chambers, then transferring the wafers, one at a time, from the pair of intermediate staging chambers into the front end processing apparatus, and removing the wafers from the front end process apparatus, preferably via a loadlock.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides a cassette-to-cassette wafer process system 30 that processes multiple wafers and combines the advantages of single wafer process chambers 43 and multiple wafer handling and processing in a tandem system for high quality wafer processing and high wafer throughput. Additionally, the wafer process system eliminates the front end staging area 21 and tandem loadlock chamber 24 of the prior tandem design (see FIG. 2) and replaces them with a front end process apparatus 40 to increase throughput of wafers by decreasing downtime associated with wafer loading/unloading and related pump-down time. The front end process apparatus 40, more fully described below, can load and unload more wafers than the prior design while also enabling staged vacuum to ultra high vacuum pressures. The wafer process system 30, therefore, has greater capacity and flexibility than prior multiple wafer process systems.

Figure 3:
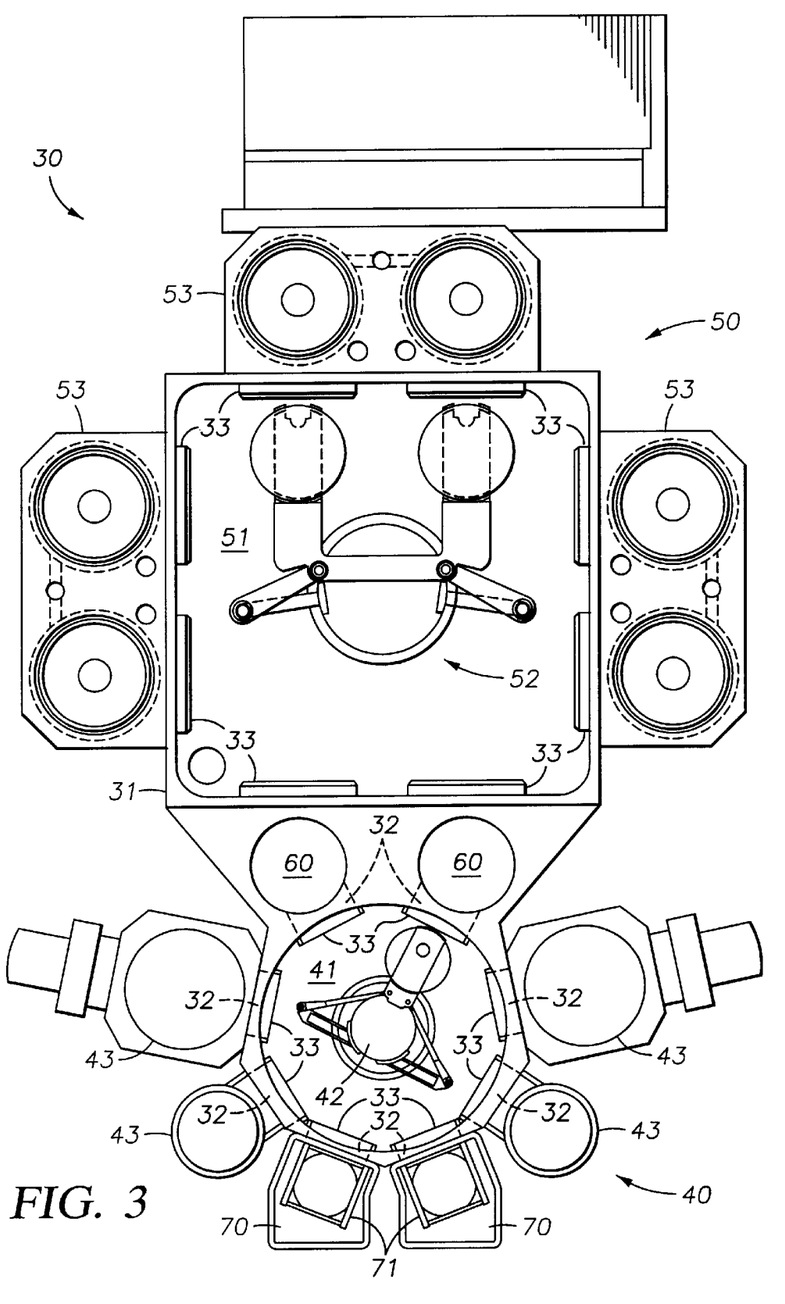
FIG. 3 is a schematic plan view of the configuration of the wafer process system of the present invention.

FIG. 3 is a schematic plan view of a configuration of a preferred embodiment of the wafer processing system 30. The system 30 includes a housing 31 that defines at least four chambers, namely a first transfer chamber 41, a second transfer chamber 51 and two intermediate staging chambers 60. This multiple transfer chamber design enables staging of vacuum levels between the first transfer chamber 41 and the second transfer chamber 51 so that an ultra high vacuum on the order of $10^{-9}$ Torr can be achieved in the second transfer chamber. This staged vacuum design is embodied in an Endura® tool, available from Applied Materials, Santa Clara, Calif., and described in U.S. Pat. No. 5,186,718, entitled "Staged-Vacuum Wafer Processing System and Method," hereby incorporated by reference. One or more loadlock chambers 70 are mounted to the first transfer chamber 41 and are in communication with the interior of the first transfer chamber 41 via access ports 32 and associated slit valves 33 to transfer wafers into and out of the system. Preferably, there are at least two loadlock chambers 70 used to transfer wafers into the system so that downtime associated with pumping down a single loadlock can be offset by alternating the loading/unloading cycles between the two loadlocks. Each loadlock chamber is configured to receive a stack of wafers, positioned vertically one above the other, held in a cassette. A plurality of vacuum process chambers 43 are mounted about the periphery of the first transfer chamber 41, and a plurality of vacuum process chambers 53 are mounted about the periphery of the second transfer chamber 51. The process chambers, 43 and 53, may be adapted for a variety of types of wafer processing including etching, deposition, cooldown, wafer orientation and the like. Access is provided to and between each of the adjacent chambers by an associated port 32 and slit valve 33.

The first transfer chamber 41 houses a first robot 42 adapted to transfer a single wafer between a loadlock 70, the connected single wafer process chambers 43, and the intermediate staging chambers 60 where the wafers can be positioned and aligned in tandem for subsequent movement in tandem through the back end of the system. Together, the first transfer chamber 41 containing the first robot 42 and mounting the interconnected loadlocks 70 and process chambers 43 define the front end process apparatus 40. Each of the process chambers 43 of the front end process apparatus 40 are adapted to process a single wafer. However, a configuration incorporating tandem chambers 53 on the first transfer chamber 41 is contemplated by the present invention. The chambers 43 may be adapted for pretreatment or post-treatment or may be adapted to perform a process operation such as CVD, PVD, or etching. In an alternative design, the front end process apparatus 40 omits the process chambers 43 and acts merely as a buffer chamber.

The front end apparatus 40 may have a symmetrical construction wherein the process chambers 43 opposite one another on either side of the first transfer chamber 41 are the same and perform the same process steps on the wafers. With a symmetrical construction of identical process chambers about its perimeter, the front end process apparatus 40 can simultaneously, but independently perform the same operation on two wafers, with only a slight lag time between the completion of the two independent operations caused by the time required for the first robot 42 to transfer one wafer into a process chamber 43 and then transfer another wafer into the identical process chamber 43 opposite the first one. In this way, the wafers from one loadlock 70 could follow a path on one side of the front end apparatus 40 while the wafers from the other loadlock 70 follow a separate path on the opposite side of the front end apparatus 40. For example, in a front end process apparatus 40 having two process chambers 43 on each side of the front end process apparatus 30, the first robot 42 would move the wafers from the loadlock 70 to the process chamber 43 nearest the loadlock 70, then to the process chamber 43 furthest from the loadlock 70, and then into the intermediate staging chamber 60. The process may be reversed with the wafers moving from chamber to chamber along their respective sides from the intermediate staging chamber 60 to the loadlocks 70. To achieve a throughput advantage using this sequence, processed wafers will return through the same staging chamber through which they entered the second transfer chamber, and be returned to the same loadlock, between the times which the wafers are removed from loadlocks 60 for processing. Alternatively, wafers may be pulled from one of the two loadlocks, and returned to the other loadlock.

Alternatively, the front end process apparatus 40 may be asymmetrical wherein the chambers opposite one another on opposing sides of the first transfer chamber 41 are dissimilar. For example, the front end process apparatus 40 may include process chambers 43 that require a relatively short process time so that duplicate chambers are unnecessary.

Preferably, a wafer cassette containing a plurality of wafers is placed within each of the loadlocks 70. The wafer cassette is supported by a moveable shaft, which is disposed through the bottom of the loadlock chamber 70. A motor, preferably a stepper motor or other elevator system, is disposed below the bottom of the loadlock chamber 70 and moves the shaft upwardly or downwardly within the loadlock chamber 70 to locate a wafer in the wafer cassette in alignment with a wafer handler/robot 42 for loading or unloading wafers from the loadlock chamber 70. A stepper motor can be controlled by an electronic controller which sends electrical pulses corresponding to the desired upward or downward movements. The first robot 42 sequentially removes the wafers from the cassette 71 and moves each wafer between the loadlocks 70, the single wafer process chambers 43 interconnected to the first transfer chamber 41 (if desired), and the intermediate staging chambers 60 which provide for transfer into the second transfer chamber 51.

The first and second transfer chambers, 41 and 51, communicate with one another via the intermediate staging chambers 60. The intermediate staging chambers 60 communicate with the first transfer chamber 41 and the second transfer chamber 51 by associated ports 32 and slit valves 33 therebetween. Specifically, the intermediate staging chambers 60 are located along a corridor, or pathway, which connects the first transfer chamber 41 to the second transfer chamber 51.

Figure 4:
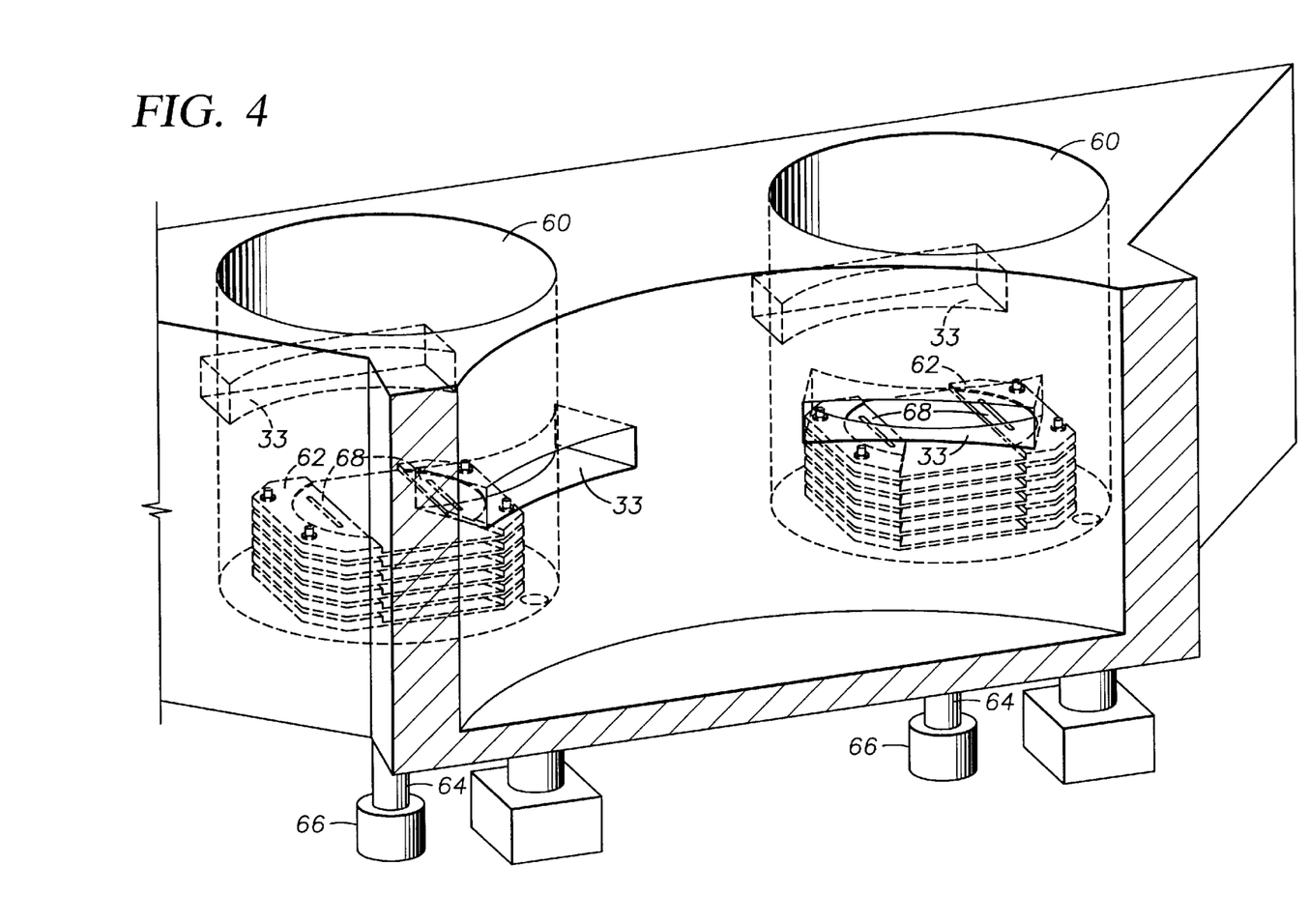
FIG. 4 is a perspective view of the wafer cassettes in the intermediate staging chambers of the present invention.

FIG. 4 is a perspective view of two intermediate staging chambers 60 of the present invention. Each of the intermediate staging chambers 60 is preferably adapted to store a plurality of wafers in a wafer cassette 62 positioned therein and which can be indexed to locate a wafer in the transfer plane. The wafer cassettes 62 are each adapted to hold a plurality of wafers in spaced vertical relationship therein on wafer supports 68. The wafer cassettes 62 are each supported by a moveable shaft 64, which is disposed through the bottom of the intermediate staging chambers 60. A motion actuator 66, such as a stepper motor, disposed below the intermediate staging chambers 60 indexes the wafer cassettes 62 vertically to sequentially align each pair of wafers with the operating plane of the tandem second robot 52. Because the tandem process system 50 preferably transfers two wafers simultaneously, the cassettes in the intermediate staging chambers 60 are spaced horizontally and indexed vertically to align the wafers in each cassette with the tandem blade disposed in the back end of the system. The cassettes and related actuators are programmed to move in unison so that the cassettes are equally vertically displaced to align pairs of wafers positioned therein. With the cassettes moving in unison, the intermediate staging chambers 60 present tandem pairs of wafers or wafer receiving slots of the cassettes for the tandem second robot 52.

In this configuration, each staging chamber wafer cassette 62 has at least a pair of vertically aligned wafer supports. Each wafer cassette 62 includes six vertically aligned wafer supports 68. However, any number of wafer supports can be employed. To transfer wafers between the first transfer chamber 41 and the second transfer chamber 51, a slit valve 33 separating the staging chamber 60 from the first transfer chamber 41 is opened, while a slit valve 33 separating the staging chamber 60 from the second process chamber 51 is in a closed position, thereby exposing the staging chamber 60 to the first transfer chamber 41, but isolating it from the second transfer chamber. Wafers are pulled from the loadlock chambers 70 or process chambers 43 by the robot 42, and placed onto a wafer support 68 on the wafer cassette 62 in the staging chamber 60, after which the wafer cassette 62 may move vertically to enable the robot to remove wafers from another cassette storage position of the wafer cassette, such wafers being wafers returning from processing in the processing chamber 53. Such wafers may be returned to the loadlocks or to degas or other chambers connecting with the first transfer chamber 41. After a wafer exchange between the staging chamber 60 and the first transfer chamber 41, the slit valves 33 between the staging chambers 60 and first transfer chamber 41 are closed, the slit valves 33 between the staging chambers 60 and the second transfer chamber 51 are opened. The second robot 52 may then simultaneously remove the wafers from the staging chambers 60, place them in a tandem process chamber 53, and return wafers from another tandem process chamber 53 into the staging chambers 60, or, first place processed wafers into the staging chambers 60, and then, after the cassette elevators move to align the incoming wafers with the second robot 52, remove the wafers from the staging chambers 60 and put them in a tandem process chamber 53. Alternatively, the second robot 52 may first load processed wafers into the staging chambers 60, and, after the cassette elevator adjusts the cassette position, remove the wafers to be processed in the tandem chamber 53. As an alternative to the cassette elevators, the robot may be vertically positionable to enable access of the blade to any wafer cassette positions.

Figure 5:
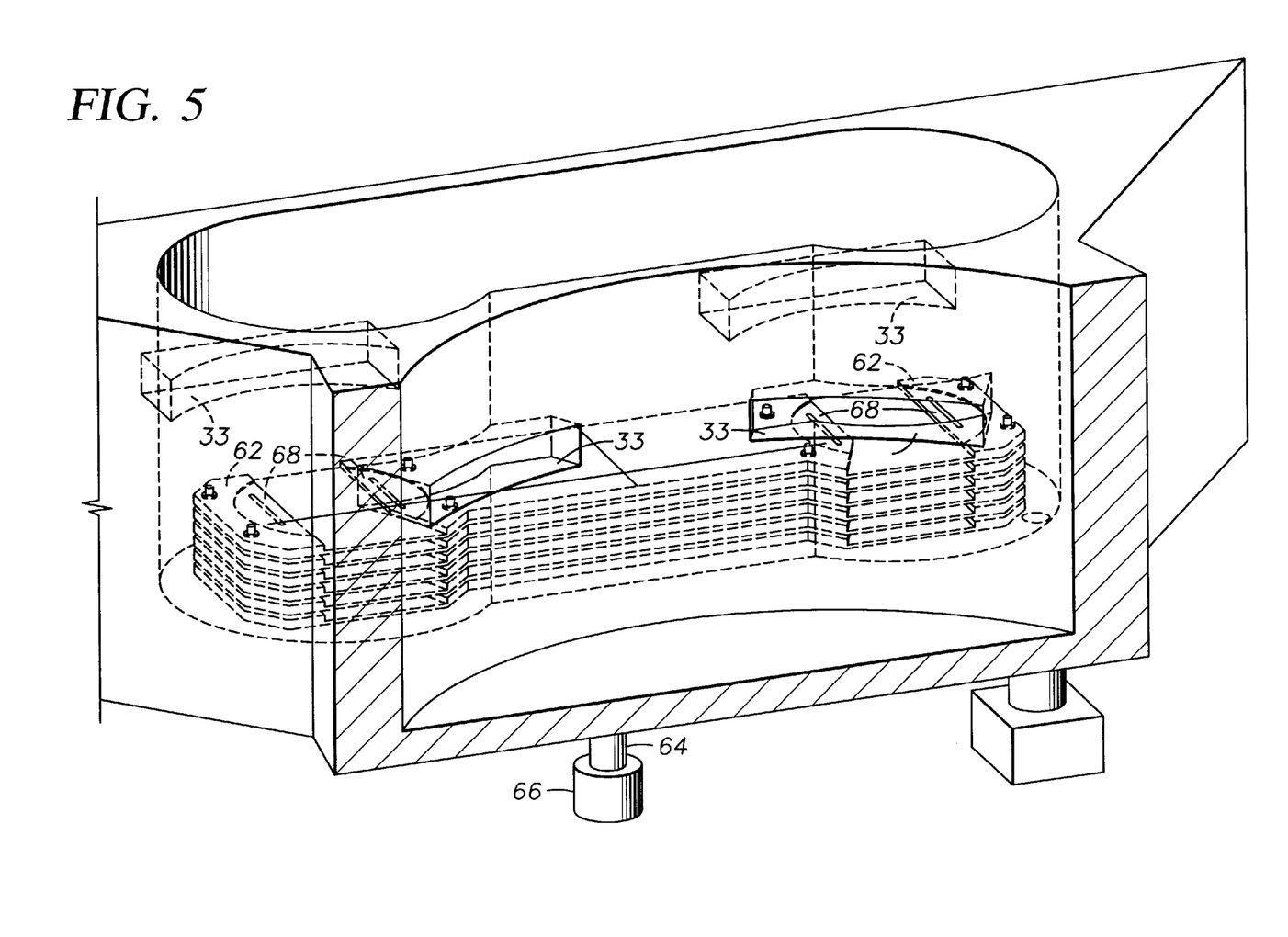
FIG. 5 is a perspective view of an alternative embodiment of the wafer cassette in the intermediate staging chamber of the present invention.

However, the intermediate staging chambers 60 may alternatively serve as process chambers wherein a process step is performed on the wafers. In this configuration, no cassette is present in the staging chambers 60, and a substrate support pedestal is used. Another alternative design for the intermediate staging chambers 60 is that they may simply act as holding chambers that facilitate the transfer of the wafers from the first robot 42 and first transfer chamber 41 to the second robot 52 and second transfer chamber 51. Accordingly, the intermediate staging chambers 60 may take virtually any form as long as they provide for communication of the wafers from the first transfer chamber 41 to the second transfer chamber 51. For example, the staging chamber may be a single chamber with a tandem wafer cassette disposed therein as shown in FIG. 5. The tandem wafer cassette 62 is supported by a moveable shaft 64 which is disposed through the bottom of the intermediate staging chamber 60. A single motion actuator 66, such as a stepper motor disposed below the intermediate staging chamber 60, indexes the tandem wafer cassette 62 to provide tandem pairs of wafers for the tandem processing chamber. As another alternative, where staged vacuum is not a concern, the staging chamber(s) may take the form of a corridor with no isolating doors, but rather only a platform onto which wafers are placed, indexed and/or removed.

The following description primarily discusses a tandem process system 50 capable of processing a pair of wafers simultaneously to which the front end process apparatus 40 supplies wafers. However, the present invention is not limited to a tandem process system 50 because the front end process apparatus 40 may be used to supply wafers to any multiple wafer process system. As used herein, the term multiple wafer process system includes any wafer process system having system components, such as robots and/or chambers, capable of transferring and/or processing more than one wafer at a time and includes tandem process systems 50 as well as batch-type process systems. For convenience and clarity, however, the following discussion describes the preferred embodiment of the present invention using the front end process apparatus 40 in conjunction with a tandem process system 50.

Preferably, the second transfer chamber 51 houses a second robot 52 adapted to transfer a pair of wafers between the intermediate staging chambers 60 and the interconnected tandem process chambers 53. Together, the second transfer chamber 51 and the attached process chambers 53 define a tandem process system 50.

Figure 6:
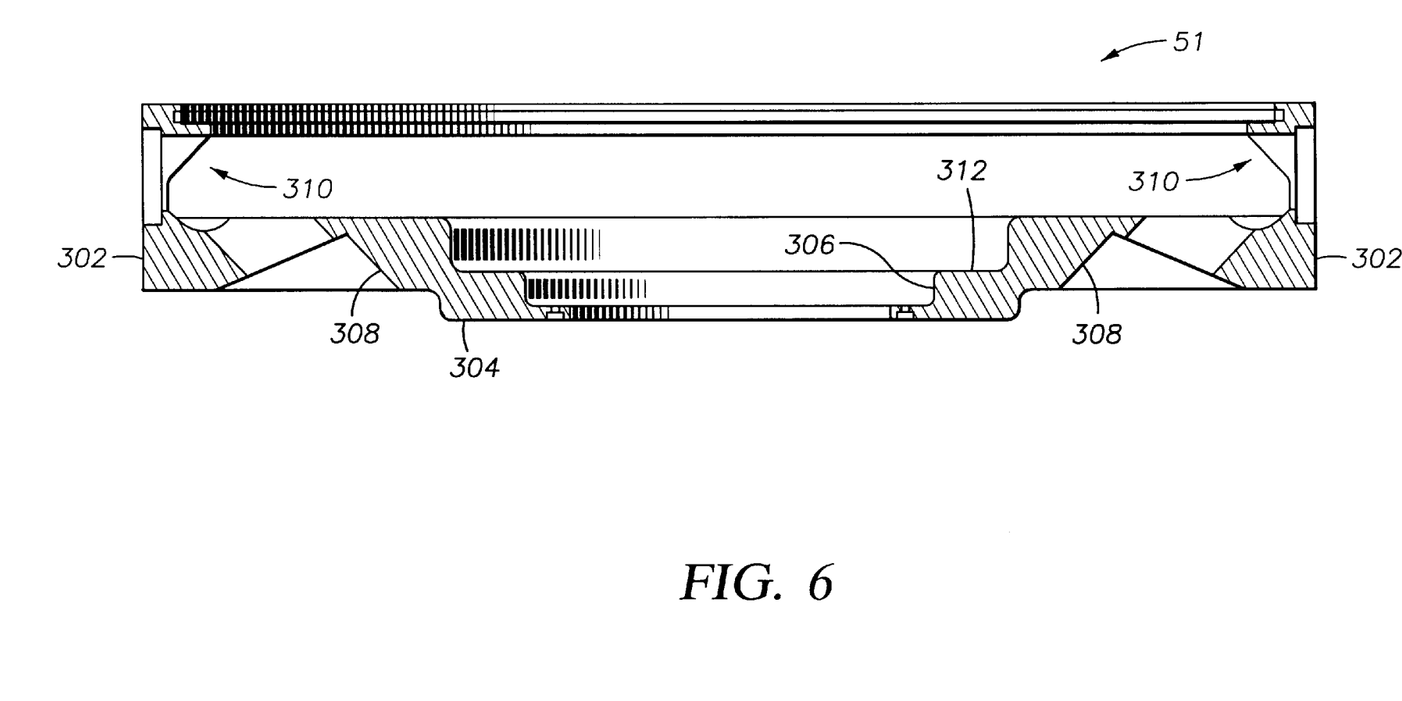
FIG. 6 is a cross sectional partial side view of a transfer chamber of the present invention.

FIG. 3 is a schematic plan view of a configuration of a preferred embodiment of the wafer processing system 30. FIG. 6 shows the second transfer chamber 51 in partial crosssection. The transfer chamber body includes sidewalls 302 and bottom 304 and is preferably machined or otherwise fabricated from one piece of material, such as aluminum. A lid (not shown) is supported on the sidewalls 302 during operation to form a vacuum enclosure. The sidewall 302 of transfer chamber 51 supports processing chambers 53 and staging chambers 60. The sidewall 302 defines at least two passages 310 on each side through which access to the other chambers on the system is provided. Each of the processing chambers 53 and staging chambers 60 include one or more slit valve openings and slit valves which enable communication between the processing chambers, the loadlock chamber and the transfer chamber while also providing vacuum isolation of the environments within each of these chambers to enable a staged vacuum within the system. The bottom 304 of the transfer chamber 51 defines a central passage 306 in which a wafer handler 52, such as a robot assembly, extends and is mounted to the bottom of the transfer chamber. In addition, the bottom 304 defines a plurality of passages 308 through which one or more slit valve actuators extend and are sealably mounted. A gas purge port (not shown) is disposed through the bottom 304 of the transfer chamber 51 to provide a purge gas during pump down.

The passages 310 disposed through the sidewalls 302 can be opened and closed using two individual slit valves or a tandem slit valve assembly. The passages 310 mate with the wafer passages 610 in process regions 618, 620 (shown in FIG. 7) to allow entry of wafers 502 into the processing regions 618, 620 in processing chambers 53 for positioning on the wafer support pedestal. Slit valves and methods of controlling slit valves are disclosed by Tepman et al. in U.S. Pat. No. 5,226,632 and by Lorimer in U.S. Pat. No. 5,363,872, both of which are incorporated herein by reference.

Figure 7:
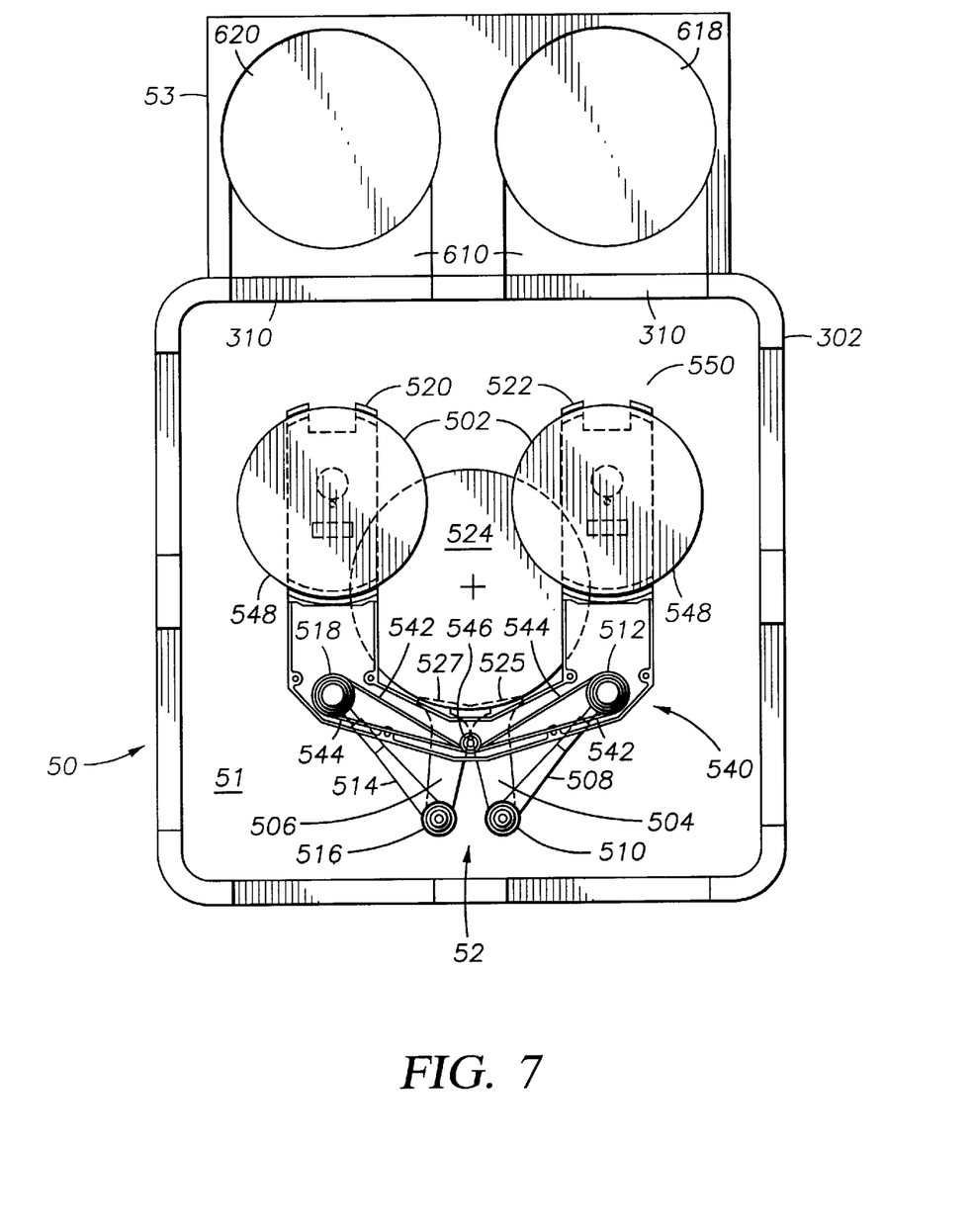
FIG. 7 is a top view of a transfer chamber and a processing chamber of the present invention showing a wafer handling member mounted in the transfer chamber and in a retracted position ready for rotation within the transfer chamber or extension into another chamber.

FIG. 7 shows a top schematic view of a magnetically coupled robot 52 of the present invention in a retracted position for rotating freely within the transfer chamber 51. A robot 52 having dual wafer handling blades 520, 522 is located within the transfer chamber 51 to transfer he wafers 502 from one chamber to another. A "very high productivity" (VHP) type robot which can be modified and used to advantage in the present invention is the subject of U.S. Pat. No. 5,469,035 issued on Nov. 21, 1995, entitled "Two-axis Magnetically Coupled Robot", and is incorporated herein by reference. The magnetically coupled robot 52 comprises a frog-leg type assembly connected between two vacuum side hubs (also referred to as magnetic clamps) and dual wafer blades 520, 522 to provide both radial and rotational movement of the robot blades within a fixed plane. Radial and rotational movements can be coordinated or combined in order to pickup, transfer and deliver two wafers from one location within the system 30 to another, such as from one processing chamber 53 to another chamber.

The robot includes a first strut 504 rigidly attached to a first magnet clamp 524 at point 525 and a second strut 506 rigidly attached to a second magnet clamp (disposed concentrically below the first magnet clamp 524) at point 527. A third strut 508 is attached by a pivot 510 to strut 504 and by a pivot 512 to the wafer blade assembly 540. A fourth strut 514 is attached by a pivot 516 to strut 506 and by a pivot 518 to the wafer blade assembly 540. The structure of struts 504, 508, 506, 514 and pivots 510, 512, 516, 518 form a "frog leg" type connection between the wafer blade assembly 540 and the magnet clamps 524, 526.

When magnet clamps 524, 526 rotate in the same direction with the same angular velocity, then robot 52 also rotates about axis A in this same direction with the same velocity. When magnet clamps 524, 526 rotate in opposite directions with the same absolute angular velocity, then there is no rotation of assembly 500, but instead, there is linear radial movement of wafer blade assembly 540.

Two wafers 502 are shown loaded on the wafer blade assembly 540 to illustrate that the individual wafer blades 520, 522 can be extended through individual wafer passages 310 in sidewall 302 of the transfer chamber 51 to transfer the wafers 502 into or out of the processing regions 618, 620 of the processing chambers 53. The magnetically coupled robot 52 is controlled by the relative rotational motion of the magnet clamps 524, 526 corresponding to the relative speed of two motors. A first operational mode is provided in which both motors cause he magnet clamps 524, 526 to rotate in the same direction at the same speed. Because this mode causes no relative motion of the magnet clamps, the robot will merely rotate about a central axis A, typically from a position suitable for wafer exchange with one pair of processing regions 618, 620 to a position suitable for wafer exchange with another pair of processing regions. Furthermore, as the fully retracted robot is rotated about the central axis A, the outermost radial points 548 along the edge of the wafer define a minimum circular region 550 required to rotate the robot. The magnetically coupled robot also provides a second mode in which both motors cause the magnet clamps 524, 526 to rotate in opposite directions at the same speed. This second mode is used to extend the wafer blades 520, 522 of the wafer blade assembly 540 through the passages 310 and into the processing regions 618, 620 or, conversely, to withdraw the blades therefrom. Other combinations of motor rotation can be used to provide simultaneous extension or retraction of the wafer blade assembly 540 as the robot 52 is being rotated about axis A.

Figure 8:
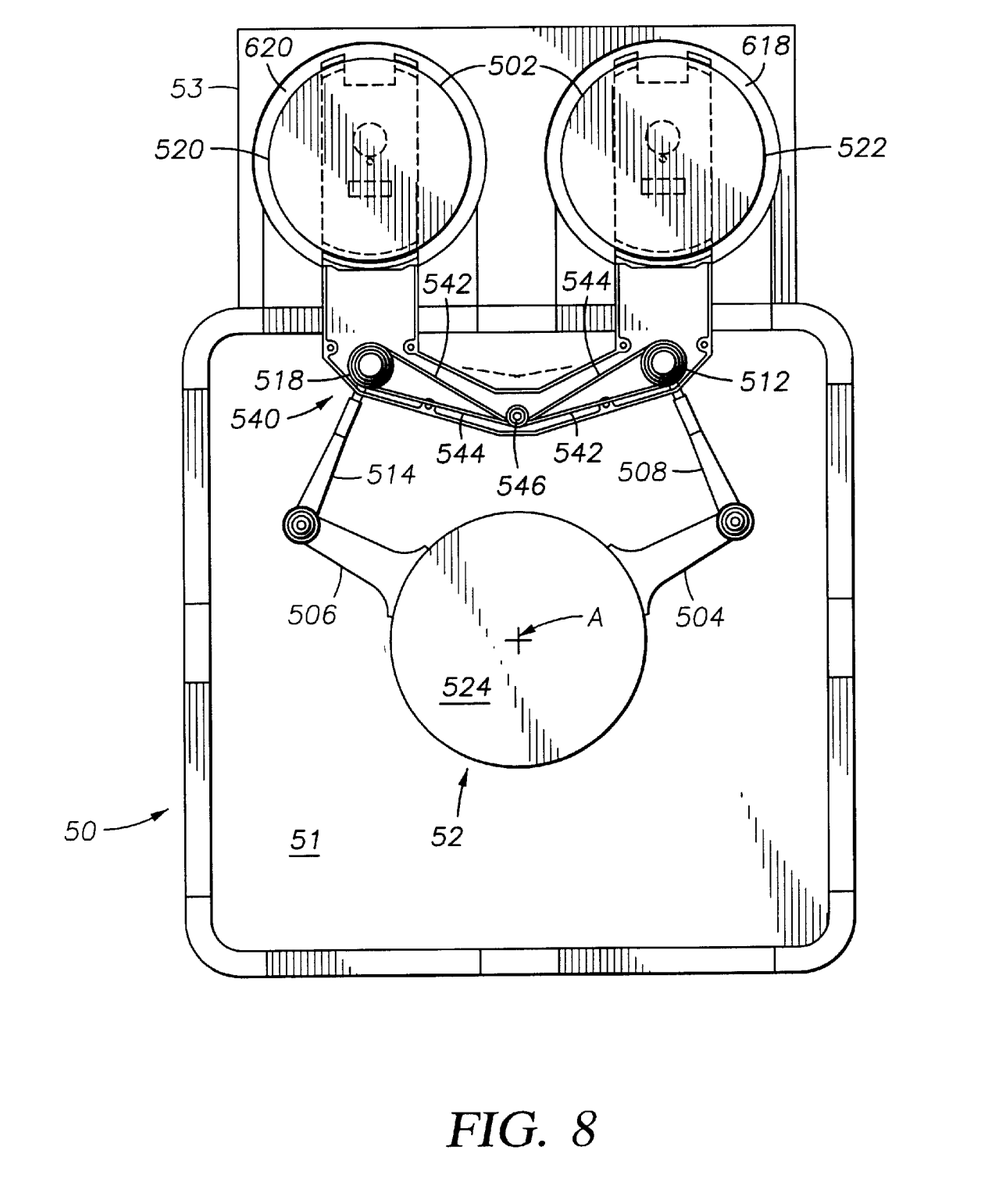
FIG. 8 is a top view of a transfer chamber and a processing chamber of the present invention showing a wafer handling member mounted in the transfer chamber and in an extended position wherein the blades are positioned in the processing chamber.

To keep the wafer blades 520, 522 of the wafer blade assembly 540 directed radially away from the rotational axis A, an interlocking mechanism is used between the pivots or cams 512, 518 to assure an equal and opposite angular rotation of each pivot. The interlocking mechanism may take on many designs, including intermeshed gears or straps pulled around the pivots in a figure-8 pattern or the equivalent. One preferred interlocking mechanism is a pair of metal straps 542 and 544 that are coupled to and extend between the pivots 512, 518 of the wafer blade assembly 540. The straps 542, 544 cooperate to form a figure-8 around the pivots 512, 518. However, it is preferred that the straps 542, 544 be individually adjustable and positioned one above the other. For example, a first end of the first strap 542 may pass around the back side of pivot 512 and be fixedly coupled thereto, while a second end passes around the front side of pivot 518 and is adjustably coupled thereto. Similarly, a first end of the second strap 544 may pass around the back side of pivot 518 and be fixedly coupled thereto, while a second end passes around the front side of pivot 512 and is adjustably coupled thereto. The adjustable couplings between the straps and the front sides of the pivots 512, 518 arc preferably provided with a spring that pulls a precise tension on the strap. Once the tension is established, the end of the trap is firmly held in position with a screw or other fastener. In FIGS. 7 and 8, the straps are also shown passing around a rod 546 at the base of the U-shaped dual blade.

FIG. 8 shows the robot arms and blade assembly of FIG. 7 in an extended position. This extension is accomplished by the simultaneous and equal rotation of magnet clamp 526 in a clock-wise direction and magnet clamp 524 in a counter-clockwise rotation. The individual blades 520, 522 of the wafer blade assembly 540 are sufficiently long to extend through the passages 310 and center the wafers 502 over the wafer support pedestals. Once the wafers 502 have been lifted from the blades by a pair of lift pin assemblies, then the blades are retracted and the passages 310 are closed by a slit valve and actuator as described above.

Replacing the front end staging area and tandem loadlock of the prior designs with the front end process apparatus 40 eliminates the reduced throughput of the prior design and provides a loadlock design that has greater throughput capability. The present invention provides for the processing of wafers from one loadlock 70, which is pumped down to the required vacuum, while wafers are transferred into and from the system in the other loadlock 70. Additionally, by adding the additional chambers of the front end process apparatus 40 and the indexing cassettes of the intermediate staging chambers 60 to the front end of the tandem process system 50, the wafer process system 30 is able to hold more wafers therein and the number and variety of processes that may be performed by the system is increased. Therefore, the front end process apparatus 40 adds both capacity and flexibility to the system.

One typical operational cycle of wafer transport through the system 30 is as follows. Initially, the first robot 42 picks up a wafer from one of the loadlocks 70 and transports the wafer to one of the single wafer process chambers 43 which illustratively pre-cleans the wafer. The first robot 42 then picks up another wafer from the same loadlock 70 and transports the wafer to another of the single wafer process chambers 43 which also illustratively pre-cleans the wafer.

The first robot 42 then transfers each of the wafers into separate intermediate staging chambers 60. The first robot 42 may transfer a plurality of pairs of wafers into the intermediate staging chamber 60 which may index the cassette therein to receive the multiple pairs. Next, the tandem second robot 52 removes a pair of wafers from the intermediate staying chambers 60 and transports them to one of the tandem process chambers 53. After processing, the second robot can transfer the pair of wafers selectively to one of the other chambers 53 for processing and then back into the intermediate staging chamber 60 which has indexed the cassette for receipt of the wafers. Then, the first robot 42 retrieves each of the wafers from the intermediate staging chamber 60 and returns them to one of the loadlocks 70.

The wafer process system 30 is designed so that each chamber stage (i.e. the loadlocks 70. the first transfer chamber 41, the single wafer process chambers 43, the intermediate staging chambers 60, the second transfer chamber 51, and the tandem process chambers 53) can be isolated from all the other chambers. None of the chambers or stages, with the exception of the loadlocks 70, is vented to atmosphere during processing. In addition, during processing, only two adjacent chambers need to be in communication at any time. As a result, variations in vacuum level and, specifically, reductions in the vacuum level during wafer transfer can be minimized by using a vacuum pumping system to provide a vacuum gradient across the system from the loadlocks 70 to the processing chambers, 43 and 53. The staged vacuum is applied across the system with the degree of vacuum in order from the loadlocks 70 to the processing chambers, 43 and 53. Consequently, the time required to pump down the process chambers, 43 and 53, to their base level subsequent to the loading of a wafer therein is minimized and very high degrees of vacuum can be used therein without lengthy pump down times and, thus, without adversely affecting system throughput. Also, since the wafers can be precleaned and or preheated before entering the high vacuum, there is less system contamination and throughput is increased.

While the foregoing is directed to the preferred embodiment of the present invention, other and further embodiments of the invention may be devised without departing from the basic scope thereof, and the scope thereof is determined by the claims which follow.

I claim:

1. A wafer process system for processing wafers, comprising:
   one or more loadlock chambers;
   a front end process apparatus communicating with the loadlock chambers, comprising:
      a first transfer chamber having a first robot disposed therein; and
      one or more process chambers communicating with the first transfer chamber;
   a side-by-side tandem tandem process system in communication with the front end process apparatus, comprising:
      a second transfer chamber having a second robot adapted to move a side-by-side pair of wafers at a time;
      one or more side-by-side tandem process chambers communicating with the second transfer chamber and having a plurality of processing regions formed within at least one of the process chambers for accommodating side-by-side wafers; and
   one or more intermediate staging chambers communicating with the first transfer chamber and the second transfer chamber.

2. The system of claim 1, wherein at least one of the loadlock chambers is adapted to contain wafer cassettes supporting a single column of wafers.

3. The system of claim 1, further comprising two loadlock chambers in communication with the front end apparatus.

4. The system of claim 1, wherein at least one of the process chambers in communication with the first transfer chamber processes wafers one at a time.

5. The system of claim 4, comprising two intermediate staging chambers disposed between the first and the second transfer chambers.

6. The system of claim 1, further comprising an actuator coupled to a wafer cassette disposed in at least one of the intermediate staging chambers.

7. The system of claim 6, further comprising at least two intermediate staging chambers disposed side-by-side and an actuator coupled to each staging chamber, wherein wafer cassettes disposed in the staging chambers and coupled to the actuators are indexed in unison.

8. The system of claim 1, wherein the second robot comprises at least two wafer blades disposed side-by-side.

9. The system of claim 8, wherein at least two of the wafer blades are coupled together.

10. The system of claim 1, further comprising a plurality of side-by-side tandem process chambers communicating with the second transfer chamber.

11. The system of claim 1, wherein at least two of the processing regions are isolated from each other.

12. A front end process apparatus adapted to supply wafers to a side-by-side multiple wafer process system, comprising:
   a first transfer chamber;
   one or more process chambers adapted to process single wafers and communicating with the first transfer chamber; and
   the first transfer chamber in communication with the side-by-side multiple wafer process system, the wafer process system comprising at least one process chamber having a plurality of processing regions formed therein for accommodating side-by-side horizontally disposed wafers.

13. The system of claim 12, further comprising at least one loadlock chamber in communication with the first transfer chamber.

14. The system of claim 12, further comprising two loadlock chambers in communication with the first transfer chamber.

15. The system of claim 12, further comprising a first robot positioned in the first transfer chamber and adapted to move one wafer at a time.

16. The system of claim 12, further comprising at least one intermediate staging chamber in communication with the first transfer chamber and the multiple wafer process system.

17. The system of claim 12, wherein at least two of the processing regions are isolated from each other.

18. A method for simultaneously processing a plurality of wafers in a wafer process system, comprising:
   introducing the wafers into a front end process apparatus adapted to handle a single wafer at a time;
   moving the wafers into a pair of interconnected intermediate staging chambers so that the pair of intermediate staging chambers each contain a wafer therein; and
   subsequently, simultaneously transferring the wafers from the pair of intermediate staging chambers to a side-by-side tandem wafer process system comprising at least one process chamber having a plurality of processing regions formed therein for accommodating side-by-side horizontally disposed wafers.

19. The method of claim 18, further comprising introducing the wafers into the front end process apparatus via at least one loadlock.

20. The method of claim 18, further comprising:
   subsequently transferring the wafers from the tandem process system back into the pair of intermediate staging chambers;
   then, transferring the wafers, one at a time, from the pair of intermediate staging chambers into the front end process apparatus; and
   removing the wafers from the front end process apparatus.

21. The method of claim 20, further comprising removing the wafers from the front end process apparatus via at least one loadlock.

22. The method of claim 18, wherein at least two of the processing regions are isolated from each other.

* * * * *

UNITED STATES PATENT AND TRADEMARK OFFICE
CERTIFICATE OF CORRECTION

PATENT NO : 6,071,055

DATED : June 6, 2000

INVENTOR(S): Tepman

It is certified that error appears in the above-identified patent and that said Letters Patent are hereby corrected as shown below:

In column 9, line 42, please replace "he" with -- the --.

In column 10, line 15, please replace "arc" with -- are --.

In column 10, line 17, please replace "trap" with -- strap --.

Signed and Sealed this

Seventeenth Day of April, 2001

*Attest:*

NICHOLAS P. GODICI

*Attesting Officer*   *Acting Director of the United States Patent and Trademark Office*